US007578368B2

(12) United States Patent
Yang et al.

(10) Patent No.: US 7,578,368 B2
(45) Date of Patent: Aug. 25, 2009

(54) SPEAKER SET FOR ELECTRONIC PRODUCT

(75) Inventors: Tsung-Lung Yang, Taipei Hsien (TW); Hsien-Sheng Pei, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 224 days.

(21) Appl. No.: 11/683,367

(22) Filed: Mar. 7, 2007

(65) Prior Publication Data

US 2008/0219490 A1 Sep. 11, 2008

(51) Int. Cl.
*H05K 5/02* (2006.01)
*H04R 1/28* (2006.01)
*H04M 1/03* (2006.01)
*H05K 5/00* (2006.01)
*H04R 1/22* (2006.01)
*H04M 1/02* (2006.01)

(52) U.S. Cl. ....................... 181/145; 181/156; 381/349; 381/351; 379/432; 379/433.02

(58) Field of Classification Search ................ 181/148, 181/145, 156, 160; 381/335, 345, 349, 351, 381/350; 379/431, 432, 433.02
See application file for complete search history.

(56) References Cited

U.S. PATENT DOCUMENTS

| | | | | |
|---|---|---|---|---|
| 4,278,851 | A * | 7/1981 | Takaya | 340/384.6 |
| 4,549,631 | A * | 10/1985 | Bose | 181/155 |
| 4,875,546 | A * | 10/1989 | Krnan | 181/160 |
| 5,092,424 | A * | 3/1992 | Schreiber et al. | 181/145 |
| 5,147,986 | A * | 9/1992 | Cockrum et al. | 181/145 |
| 5,461,672 | A * | 10/1995 | Enokido et al. | 379/433.02 |
| 5,471,019 | A * | 11/1995 | Maire | 181/156 |
| 5,731,553 | A * | 3/1998 | Ledoux | 181/156 |
| 5,790,679 | A * | 8/1998 | Hawker et al. | 381/163 |
| 5,953,414 | A * | 9/1999 | Abraham et al. | 379/433.02 |
| 6,002,949 | A * | 12/1999 | Hawker et al. | 455/569.1 |
| 6,144,738 | A * | 11/2000 | Hawker et al. | 379/433.02 |
| 6,321,070 | B1 * | 11/2001 | Clark et al. | 455/575.1 |
| 6,389,145 | B2 * | 5/2002 | Baumhauer et al. | 381/345 |
| 6,389,146 | B1 * | 5/2002 | Croft, III | 381/345 |
| 6,431,309 | B1 * | 8/2002 | Coffin | 181/156 |
| 6,490,361 | B1 * | 12/2002 | Klein | 381/353 |
| 6,493,456 | B1 * | 12/2002 | Hansson | 381/345 |
| 6,522,759 | B1 * | 2/2003 | Mori | 381/150 |
| 6,526,150 | B2 * | 2/2003 | Kelly et al. | 381/353 |
| 6,553,119 | B1 * | 4/2003 | Mori | 379/433.11 |
| 6,758,303 | B2 * | 7/2004 | Zurek et al. | 181/155 |
| 6,834,744 | B2 * | 12/2004 | Toki | 181/148 |

(Continued)

*Primary Examiner*—Edgardo San Martin
(74) *Attorney, Agent, or Firm*—Frank R. Niranjan

(57) ABSTRACT

A speaker set (20) for an electronic product (100) includes a hollow shell (60), and a loudspeaker (50) accommodated in the shell. The shell includes at least a spacing plate (68) which divides an inner space of the shell into a first resonance chamber (61*a*) and a second resonance chamber (61*b*). The loudspeaker includes first tone holes (52) communicating with the first resonance chamber and second tone holes (54) communicating with the second resonance chamber. The second resonance chamber communicates with the first resonance chamber via at least an inverted hole (69) defined in the at least a spacing plate. The first resonance chamber communicates with a surrounding environment so that sound emitted from the first and second tone holes of the loudspeaker can be transferred to the surrounding environment.

15 Claims, 8 Drawing Sheets

U.S. PATENT DOCUMENTS 6,876,743 B2 * 4/2005 Asahina et al. ........ 379/433.02
6,907,955 B2 * 6/2005 Masuda ...................... 181/148
6,912,290 B1 * 6/2005 Thorsell et al. ............. 381/338
7,136,498 B1 * 11/2006 Schott ........................ 381/351
7,346,315 B2 * 3/2008 Zurek et al. ................ 455/90.3
7,400,910 B2 * 7/2008 Matsumoto et al. ......... 455/570
2002/0051552 A1 * 5/2002 Schott ........................ 381/345
2002/0061114 A1 * 5/2002 Croft, III .................... 381/345
2004/0071303 A1 * 4/2004 Furuya et al. ............... 381/182
2005/0168958 A1 * 8/2005 Finney et al. ............... 361/752
2005/0190941 A1 9/2005 Yang
2005/0233781 A1 * 10/2005 Erixon et al. ............ 455/575.1
2007/0154053 A1 * 7/2007 Yang .......................... 381/386
2007/0242848 A1 * 10/2007 Yang .......................... 381/386

* cited by examiner

SPEAKER SET FOR ELECTRONIC PRODUCT

CROSS-REFERENCES TO RELATED APPLICATION

This application is related to co-pending U.S. patent application Ser. No. 11/611,709, filed on Dec. 25, 2006, and entitled "SPEAKER SET AND MOBILE PHONE INCORPORATING THE SAME", and co-pending U.S. patent application Ser. No. 11/683,361, entitled "SPEAKER SET AND ELECTRONIC PRODUCT INCORPORATING THE SAME", and filed on the same date with the present application. The present application and the co-pending applications are assigned to the same assignee. The disclosures of the above-identified applications are incorporated herein by reference.

BACKGROUND OF THE INVENTION

1. Field of the Invention

The present invention relates generally to speaker sets for portable electronic products and, more particularly, to a speaker set for an electronic product, which gives the electronic product compact size and good sound quality.

2. Description of Related Art

Portable electronic products, such as mobile phones, CD players, MP3s, PDAs (Personal Digital Assistants) and the like, have decreased both in size and weight over the past few years and are becoming ever more popular with travelers. This demand for smaller size with ever-increasing capability has required a tremendous effort to continually shrink many of the components contained within the device.

However, portable electronic products being designed today require multi-media features and should be able to provide the user with the same enjoyable experience as that experienced with conventional high quality desktop systems. Thus, the sounds emanating from a portable electronic product should provide as full a harmonic content as is contained in the original sound. The production of low frequency sounds requires a large acoustic chamber for the movement of a large mass of air. As the device is reduced in size, the size of the acoustic chamber of the speaker set and the maximum power the speaker can handle are also accordingly reduced, resulting in both a reduction in loudness as well as a poorer overall quality of sound. However, increasing the device size to increase the size of the acoustic chamber for the speaker is very undesirable since it would strongly detract from the very characteristics that have helped to make these devices popular, namely their size and weight. Thus the size of the device is at odds with sound quality of the speaker.

Therefore, a portable electronic product having compact size and good sound quality is highly needed.

SUMMARY OF THE INVENTION

The present invention relates to a speaker set for an electronic product, which gives the electronic product compact size and good sound quality. According to a preferred embodiment of the present invention, the speaker set includes a hollow shell, and a loudspeaker accommodated in the shell. The shell includes at least a spacing plate which divides an inner space of the shell into a first resonance chamber and a second resonance chamber. The loudspeaker includes first tone holes communicating with the first resonance chamber and second tone holes communicating with the second resonance chamber. The second resonance chamber communicates with the first resonance chamber via at least an inverted hole defined in the at least a spacing plate. The first resonance chamber communicates with a surrounding environment so that sound emitted from the first and second tone holes of the loudspeaker can be transferred to the surrounding environment.

Other advantages and novel features of the present invention will become more apparent from the following detailed description of preferred embodiment when taken in conjunction with the accompanying drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
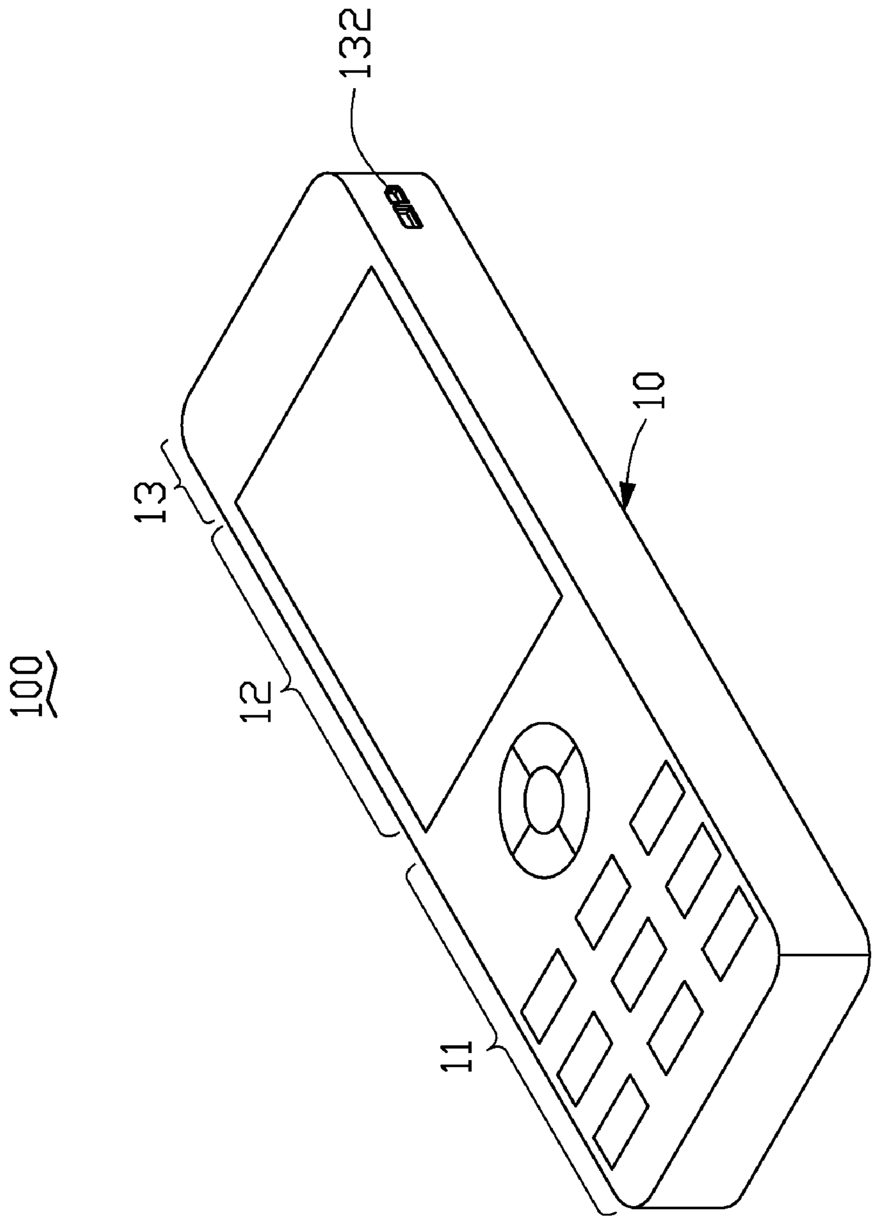
FIG. 1 is an isometric view of a mobile phone incorporating therein a speaker set in accordance with the present invention.

Referring to FIG. 1, a mobile phone 100 incorporating therein a speaker set according to the present invention is shown. The mobile phone 100 includes a hollow casing 10 and a variety of elements enclosed therein. The casing 10 is substantially rectangular shaped in profile, and includes a keypad 11, a display panel 12, and a speaker section 13 respectively disposed at bottom, middle and top portions of the casing 10. The casing 10 defines a vent hole 132 at one side of the speaker section 13.

Figure 2:
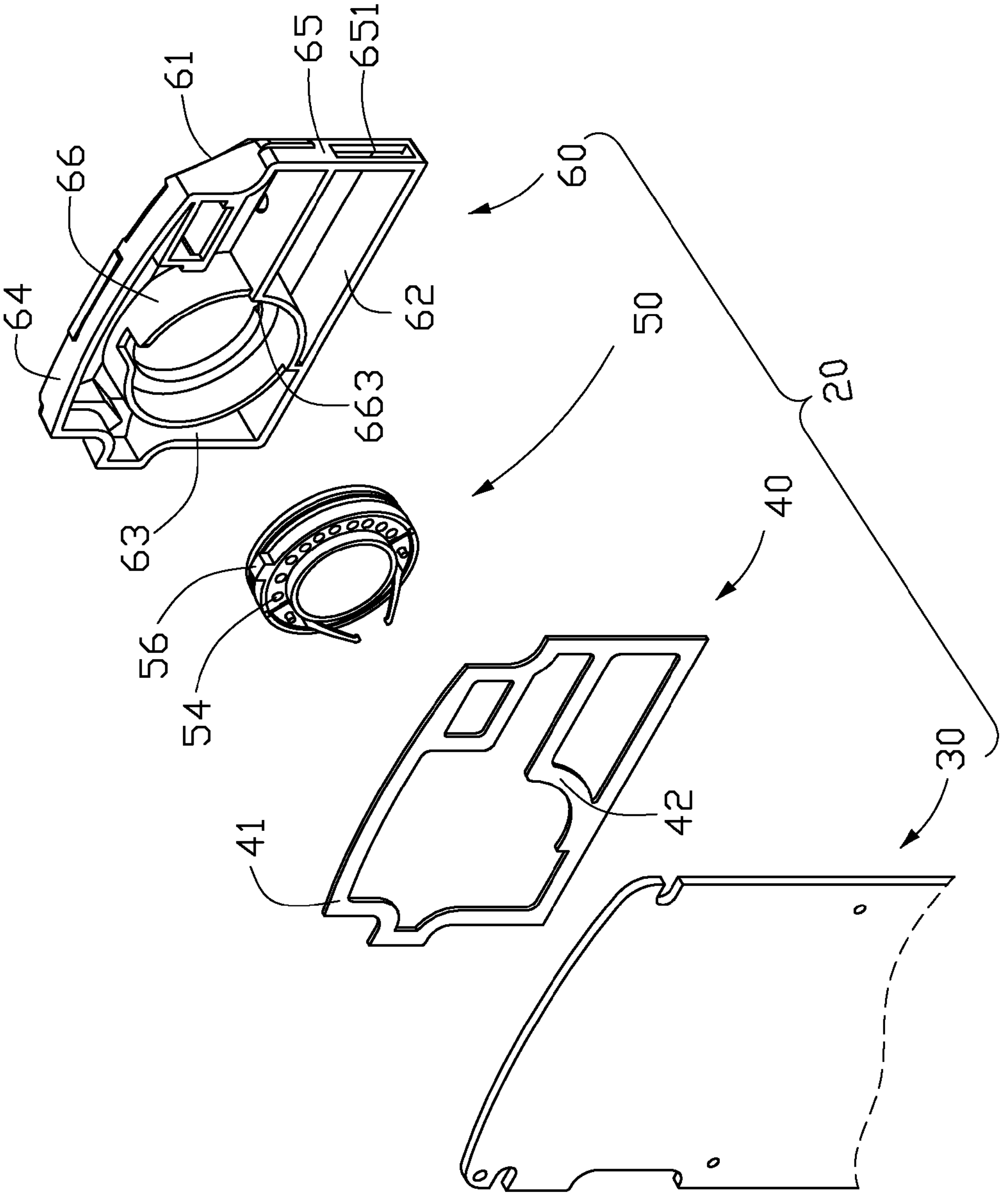
FIG. 2 is an exploded, isometric view of a speaker set of the mobile phone of FIG. 1.
Figure 3:
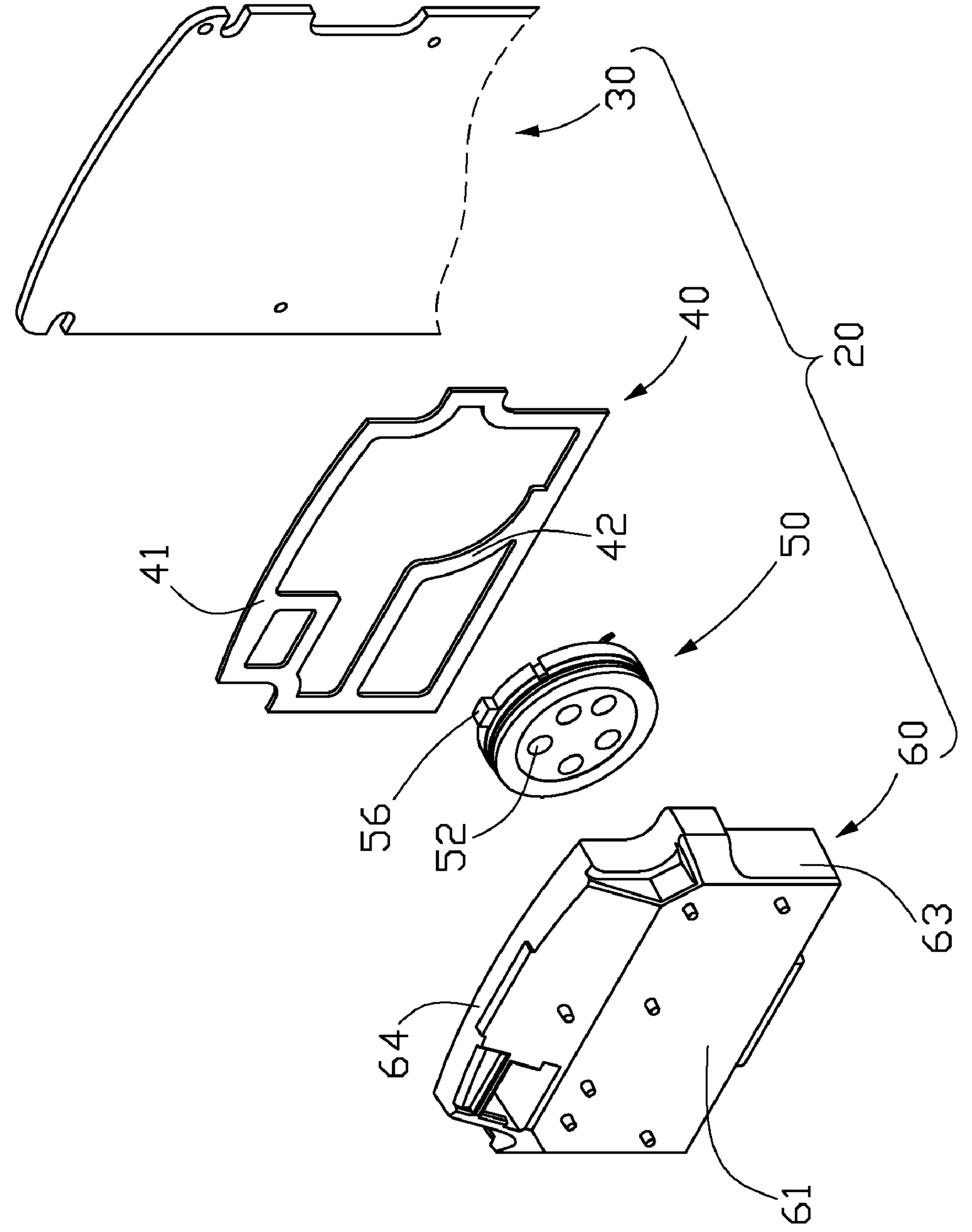
FIG. 3 is similar to FIG. 2, but viewed from another aspect thereof.

Referring to FIGS. 2 and 3, a speaker set 20 is disposed in the speaker section 13 of the casing 10 and includes a printed circuit board 30, a hollow shell 60, a loudspeaker 50 accommodated in the shell 60, and a hollow frame 40 sandwiched between the shell 60 and the printed circuit board 30 of the mobile phone 100.

Figure 4:
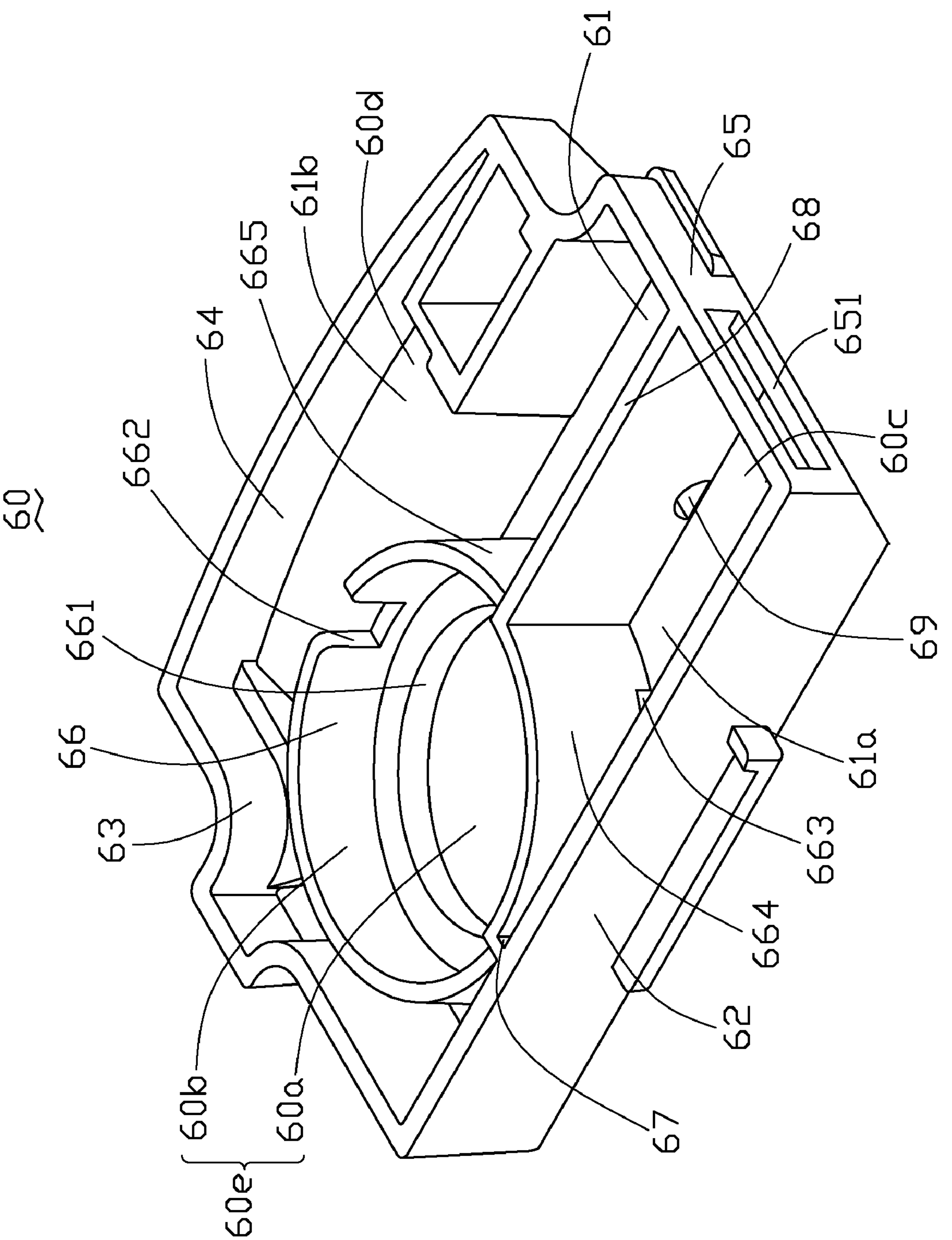
FIG. 4 is an isometric view of a shell of the speaker set of FIG. 2.
Figure 5:
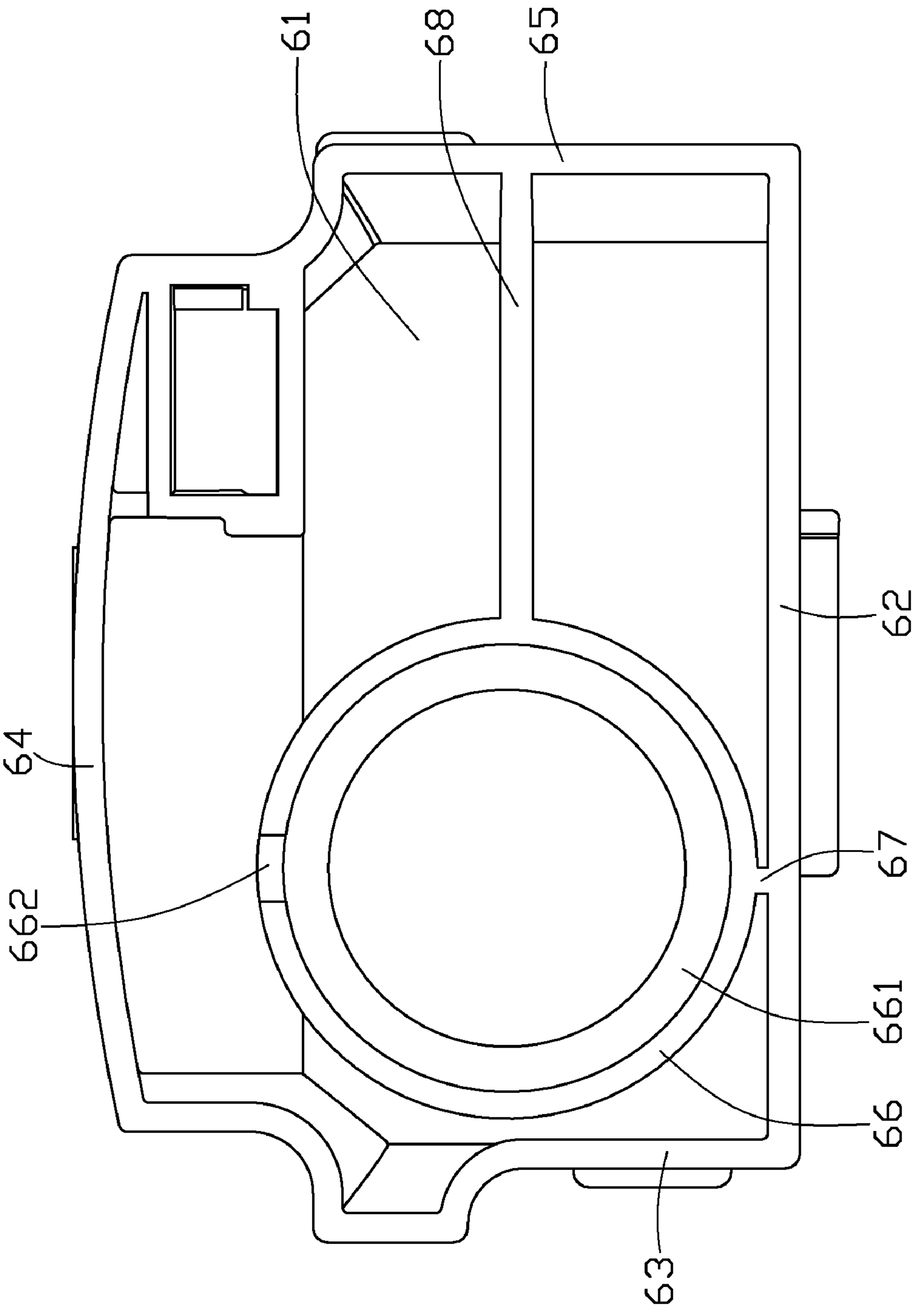
FIG. 5 is a top view of the shell of FIG. 4.

Referring to FIGS. 4-5, the shell 60 of the speaker set 20 is a half-opened structure, and includes a base wall 61 and a plurality of sidewalls 62, 63, 64, 65 perpendicularly extending upwardly from a periphery of the base wall 61. An annular wall 66 perpendicularly and upwardly extends from a middle portion of the base wall 61. The annular wall 66 separates a predetermined distance from the sidewalls 62, 63, 64, 65. Two spacing plates 67, 68 extend upwardly from the base wall 61 and connect the annular wall 66 with the corresponding sidewalls 62, 65. The spacing plates 67, 68 are perpendicular to each other, and include a vertical one and a horizontal one above the vertical one. A front surface of each of the spacing plates 67, 68 is coplanar with a front surface of each of the sidewalls 62, 63, 64, 65. The spacing plates 67, 68 and the annular wall 66 cooperatively divide a space formed between the base wall 61 and the sidewalls 62, 63, 64, 65 into three sub-chambers, i.e. a first chamber 60*e*, a second chamber 60*d* and a third chamber 60*c*. Alternatively, when the annular wall 66 is disposed in contact with the sidewall 62 of the shell 60, the vertical spacing plate 67 can be omitted; there are only one (i.e., the horizontal) spacing plate 68 and the annular wall 66 dividing the space formed between the base wall 61 and the sidewalls 62, 63, 64, 65 into the three sub-chambers. A portion of the base wall 61 in the annular wall 66 forms a flange 661 protruding upwardly in the first chamber 60*e*. The flange 661 is annular and contacts with an inner side of the annular wall 66. The loudspeaker 50 is mounted on the flange 661 and is accommodated in the first chamber 60*e* to divide the first chamber 60*e* into two isolated chambers, i.e., a front chamber 60*b* and a rear chamber 60*a*. A front surface of a first edge portion 664 of the annular wall 66 corresponding to the third chamber 60*c* is coplanar with the front surface of each of the sidewalls 62, 63, 64, 65. The first edge portion 664 defines a slot 663 at a bottom thereof so as to communicate the rear chamber 60*a* of the first chamber 60*e* with the third chamber 60*c*. A front surface of a second edge portion 665 of the annular wall 66 corresponding to the second chamber 60*d* is lower than that of the first edge portion 664 of the annular wall 66 so that a height difference is formed therebetween which communicates the front chamber 60*b* of the first chamber 60*e* with the second chamber 60*d*. The spacing plate 68 connects a joint of the first and second edge portions 664, 665 of the annular wall 66 with a middle portion of the sidewall 65.

The second edge portion 665 defines a cutout 662 at top thereof, so as to receive an ear 56 (shown in FIG. 2) of the loudspeaker 50 therein, thereby preventing the loudspeaker 50 from rotating in the first chamber 60*e*. The sidewall 65 of the shell 60 defines therein a vent hole 651 communicating with the third chamber 60*c*. The vent hole 651 of the shell 60 communicates with the vent hole 132 of the casing 10 so as to communicate the third chamber 60*c* with the surrounding environment.

The spacing plate 68 of the shell 60 defines an inverted hole 69 at bottom thereof. The inverted hole 69 has a semicircular cross section and communicates the third chamber 60*c* with the second chamber 60*d*. Sound waves in the second chamber 60*d* diffuse into the third chamber 60*c* via the inverted hole 69.

Particularly referring to FIGS. 2 and 3, the loudspeaker 50 is column shaped in profile, and defines a plurality of first tone holes 52 facing towards the rear chamber 60*a* of the first chamber 60*e* and a plurality of second tone holes 54 facing towards the front chamber 60*b* of the first chamber 60*e*. The loudspeaker 50 electrically connects with the printed circuit board 30 so as to receive electrical signals from the printed circuit board 30 and convert the electric signals into acoustic signals. The acoustic signals drive a diaphragm (not shown) of the loudspeaker 50 to oscillate and generate sound waves. The sound waves are transmitted from the loudspeaker 50 via the first and second tone holes 52, 54.

Figure 6:
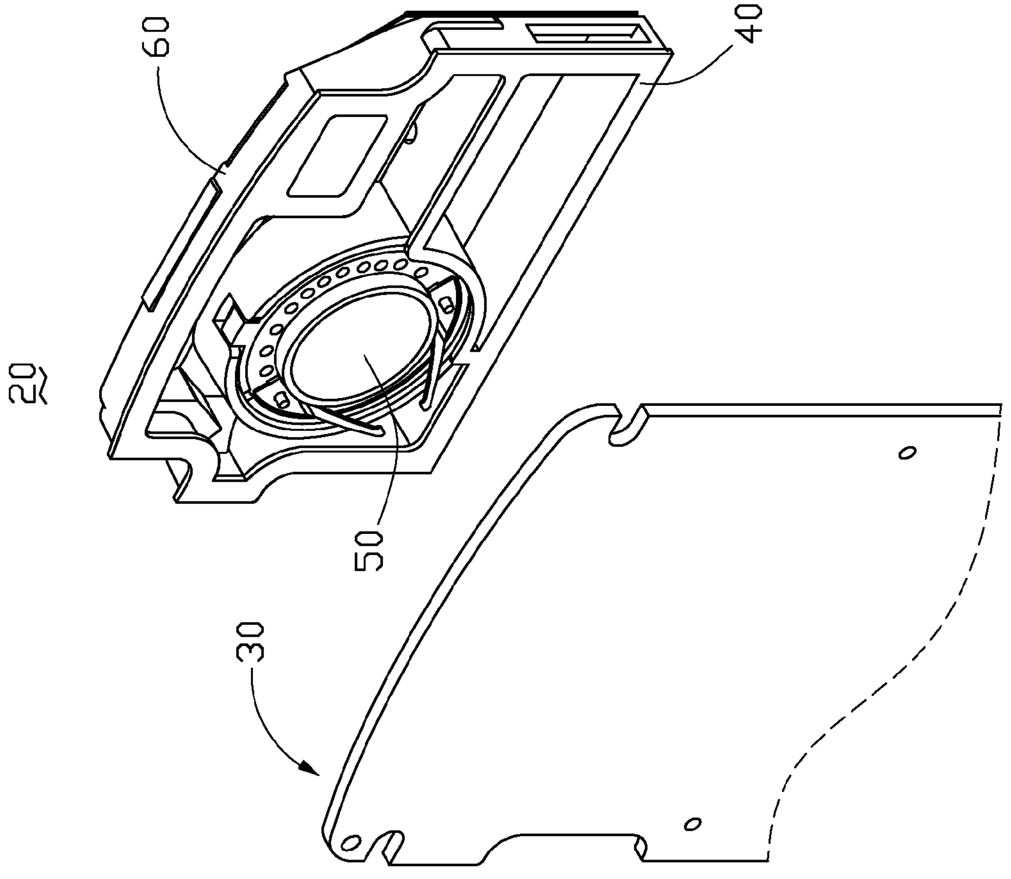
FIG. 6 is a partly assembled view of the speaker set of FIG. 2.

Referring to FIGS. 2-3 and 6, the hollow frame 40 is sandwiched between the front surfaces of the sidewalls 62, 63, 64, 65 of the shell 60 and a rear surface of the printed circuit board 30. The hollow frame 40 is made of anti-vibration materials such as rubber, glass fiber cloth, or foam plastic. The hollow frame 40 includes an outer frame 41 and an inner frame 42 disposed in the outer frame 41. The outer frame 41 has a similar periphery configuration to the periphery configuration of the shell 60 when viewed from the front. The inner frame 42 has a similar periphery configuration to the periphery configuration of a space enclosed by the spacing plates 67, 68 and the first edge portion 664 of the annular wall 66 when viewed from the front. The hollow frame 40 should preferably be designed to allow a large volume to be enclosed therein without decreasing the anti-vibration capability thereof.

In assembly of the speaker set 20 in the mobile phone 100, the printed circuit board 30 is disposed in the casing 10 of the mobile phone 100. The loudspeaker 50 is assembled in the annular wall 66 and mounted on the flange 661. The hollow frame 40 is assembled on an open side (front side) of the shell 60, with rear surfaces of the outer and inner frames 41, 42 contacting with the corresponding front surfaces of the sidewalls 62, 63, 64, 65, of the first edge portion 664 of the annular wall 66 and of the spacing plates 67, 68. The assembled shell 60, loudspeaker 50 and hollow frame 40 are arranged in the casing 10 of the mobile phone 100, with front surfaces of the outer and inner frames 41, 42 contacting with a rear surface of the printed circuit board 30. Therefore, two communicated Helmholtz resonance chambers, i.e., a first resonance chamber 61*a* communicating with the first tone holes 52 of the loudspeaker 50 and consisting of the rear chamber 60*a* and the third chamber 60*c*, and a second resonance chamber 61*b* communicating with the second tone holes 54 of the loudspeaker 50 and consisting of the front chamber 60*b* and the second chamber 60*d*, are formed in the shell 60.

In the assembly of the speaker set 20 in the mobile phone 100, there are adhesives filled in interstices formed between the frame 40 and the printed circuit board 30 and the shell 60 so as to keep a hermetical contact therebetween. Therefore, the sound waves in the second and third chambers 60*d*, 60*c* can not leak from the interstices, and the first resonance chamber 61*a* accordingly communicates with the second resonance chamber 61*b* merely via the inverted hole 69. The sound waves emitted from the first and second tone holes 52, 54 of the loudspeaker 50 are respectively transmitted to and resonate with air in the first and second resonance chambers 61*a*, 61*b* at the natural frequencies thereof. The sound waves in the second resonance chamber 61*b* are then transmitted into the first resonance chamber 61*a* via the inverted hole 69 and further resonate with the air in the first resonance chamber 61*a*. Finally, the sound waves are transmitted to the surrounding environment via the vent holes 651, 132 of sidewall 65 of the shell 60 and the casing 10.

In the present mobile phone 100, the inverted hole 69 inverts phases of the sound waves in the second resonance chamber 61*b* into phases which are coincident with phases of the sound waves in the first resonance chamber 61*a*. Thus, the sound waves transmitted towards the first resonance chamber 61*a* from the second resonance chamber 61*b* superpose with the sound waves in the first resonance chamber 61*a*, which widens the frequency bandwidth of the sound waves emitting from the shell 60. Accordingly, a crest of a frequency response curve of the sound waves emitting from the shell 60 moves towards a lower frequency as compared to a crest of a frequency response curve of sound waves emitting from a shell 60 without the inverted hole 69 disposed therein. Therefore, the lower frequency range of the sounds emitted from the mobile phone 100 is widened and the low-frequency sound emitted from the mobile phone 100 is boosted which increases sound quality of the mobile phone 100. When the acoustic field of the singular first and second resonance chambers 61*a*, 61*b* and the shell 60 including the communicated first and second resonance chambers 61*a*, 61*b* are simulated by using SYSNOISE software distributed by LMS North America, 5455 Corporate Drive, Suite 303, Troy, Mich. 48098, it was found that the response frequency of the singular first resonance chamber 61*a* is 3000 HZ, the response frequency of the singular second resonance chamber 61*b* is 6500 HZ, and the response frequency of shell 60 is 1016 HZ. The response frequency of the shell 60 is responsive to ear, thus allowing high quality sounds to be made by the present mobile phone 100.

In addition, the hollow frame 40 weakens the vibration caused by the sound waves transferring towards the printed circuit board 30, which prevents the quality of the sound from being impaired by the vibration. The hollow frame 40 has hermetic seal with the printed circuit board 30 and the shell 60 of the speaker set 20, which prevents the sounds from leakage from interstices formed between the printed circuit board 30 and the shell 60 of the speaker set 20.

Figure 7:
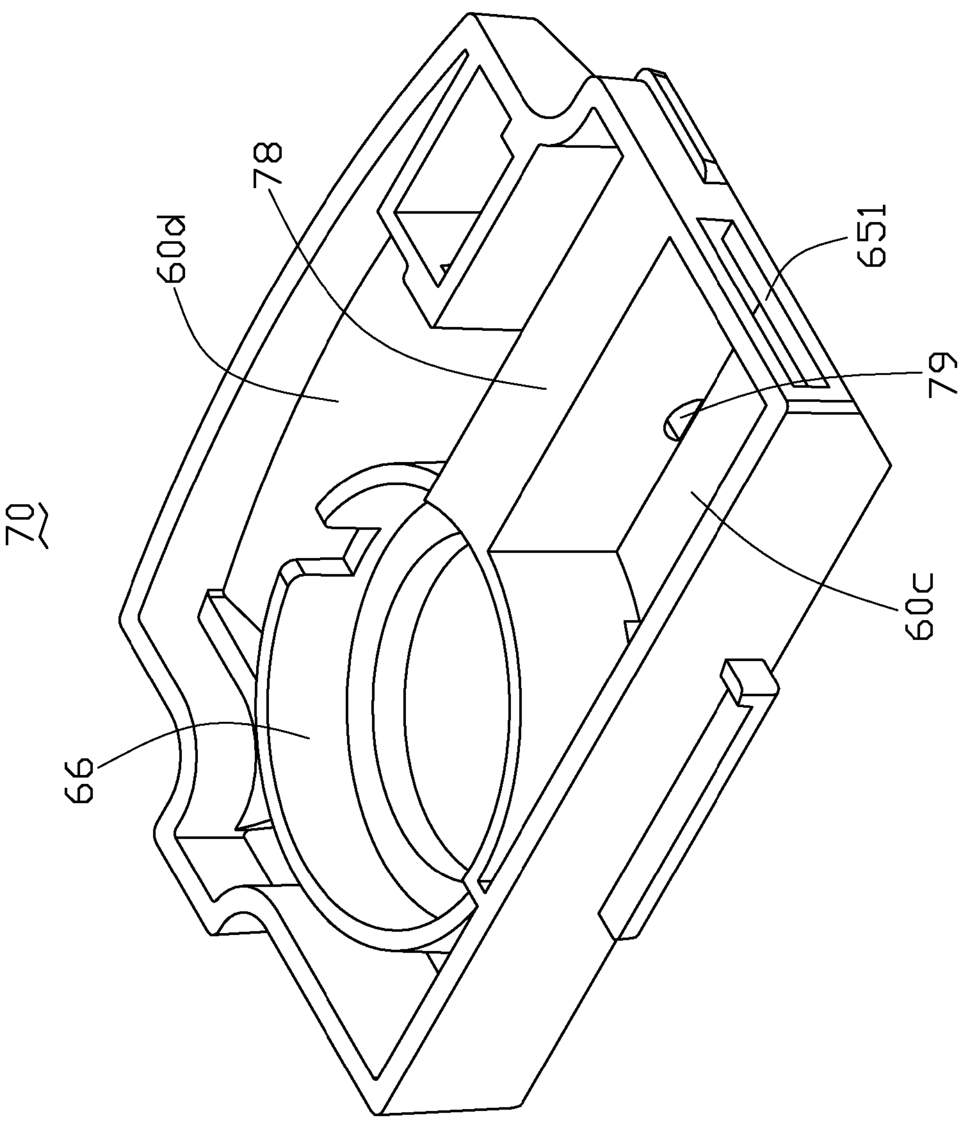
FIG. 7 is an isometric view of a shell of a speaker set according to a second embodiment of the present invention.

Referring to FIG. 7, a second embodiment of a shell 70 of the speaker set 20 of the present mobile phone 100 is shown. The difference between the second embodiment and the first embodiment is: a thickness of the spacing plate 78 in the second embodiment is greater than that of the spacing plate 68 in the first embodiment. Moreover, the thickness of the spacing plate 78 is greater than that of the sidewall 62/63/64/65 of the shell 60. A length of the inverted hole 79 is hence longer than that of the inverted hole 69. When the acoustic field of the shell 70 of the second embodiment is simulated by using SYSNOISE software distributed by LMS North America, 5455 Corporate Drive, Suite 303, Troy, Mich. 48098, it was found that and its response frequency is lowered to 704 HZ which is lower than that of the shell 60 in the first embodiment and satisfies a lower response frequency need for the mobile phone 100. In the present shell 70, the thickness of the spacing plate 78 can be designed to make the response frequency of the shell 70 satisfy different kinds of mobile phones similar to the model shown.

Figure 8:
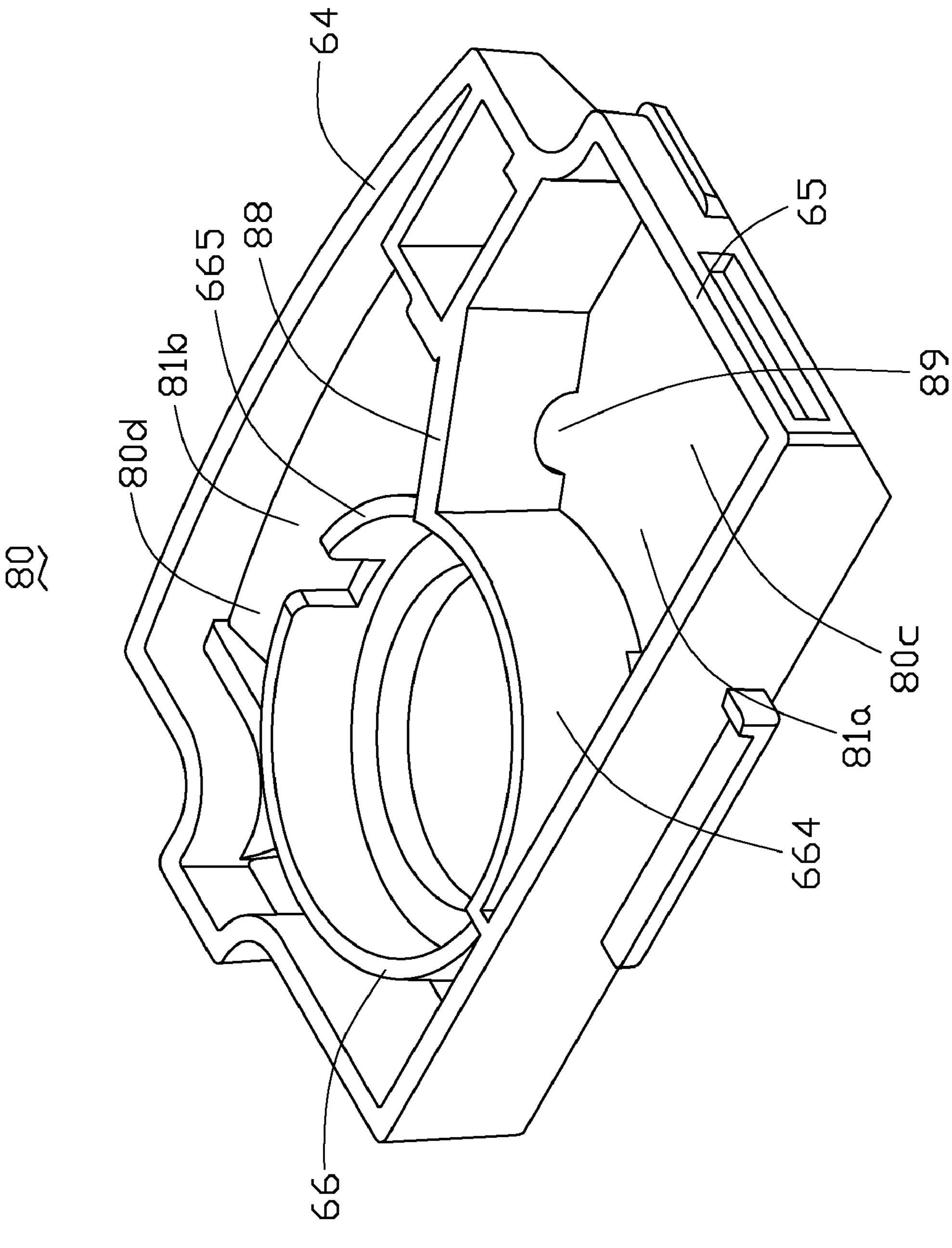
FIG. 8 is an isometric view of a shell of a speaker set according to a third embodiment of the present invention.

Referring to FIG. 8, a third embodiment of a shell 80 of the speaker set 20 of the present mobile phone 100 is shown. In this embodiment, the spacing plate 88 extends from the joint of the first and second edge portions 664, 665 of the annular wall 66 towards a joint of the sidewalls 64, 65 of the shell 80. A volume of the third chamber 80*c* and the first resonance chamber 81*a* is accordingly increased, whilst a volume of the second chamber 80*d* and the second resonance chamber 81*b* is decreased. When the acoustic field of the shell 80 of the third embodiment is simulated by using SYSNOISE software distributed by LMS North America, 5455 Corporate Drive, Suite 303, Troy, Mich. 48098, it was found that its response frequency is 1427 HZ which is higher than that of the shell 60 in the first embodiment and satisfies a higher response frequency need for the mobile phone 100.

The present speaker set 20 is disposed in a mobile phone 100. Alternatively, the speaker set 20 is capable of being used in other kinds of portable electronic products, such as PDAs (personal digital assistants), CD players, MP3s and MP4s. The inverted hole 69/79/89 of the speaker set 20 communicates the first resonance chamber 61*a*/81*a* with the second resonance chamber 61*b*/81*b* and helps the portable electronic products be compact as well as having good sound quality. Furthermore, the thickness and the position of the spacing plate 68/78/88 can be designed to help the portable electronic products be compact as well as having good sound quality.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of portions within the principles of the invention to the full extent indicated by the broad general meaning of the terms in which the appended claims are expressed.

What is claimed is:

1. A speaker set configured for an electronic product comprising:

a hollow shell comprising at least a spacing plate which divides an inner space of the shell into a first resonance chamber and a resonance second chamber; and a loudspeaker accommodated in the shell, and having first tone holes communicating with the first resonance chamber and second tone holes communicating with the second resonance chamber, the second resonance chamber communicating with the first resonance chamber via at least an inverted hole defined in the at least a spacing plate, the first resonance chamber communicating with a surrounding environment so that sound emitted from the first and second tone holes of the loudspeaker can be transferred to the surrounding environment;

wherein the shell is divided into a first chamber, a second chamber and a third chamber, the loudspeaker being accommodated in the first chamber and dividing the first chamber into a front chamber and a rear chamber, the first resonance chamber consisting of the rear chamber and the third chamber, the second resonance chamber consisting of the front chamber and the second chamber; and wherein the shell comprises a base wall and a plurality of sidewalls surrounding the base wall, the first chamber being enclosed by an annular wall extending from the base wall, the second and third chambers being formed between the base wall, the sidewalls and a periphery of the annular wall, and being isolated from each other by the at least a spacing plate disposed between the annular wall and a corresponding sidewall.

2. The speaker set as described in claim 1, wherein the annular wall comprises a first edge portion disposed corresponding to the third chamber and a second edge portion disposed corresponding to the second chamber, the third chamber communicating with the rear chamber of the first chamber via a slot defined at a bottom of the first edge portion, the second chamber communicating with the front chamber of the first chamber via a height difference formed between a front surface of the second edge portion of the annular wall and a front surface of the first edge portion of the annular wall.

3. The speaker set as described in claim 2, wherein the at least a spacing plate connects a joint of the first and second edge portions of the annular wall with a middle portion of the corresponding sidewall.

4. The speaker set as described in claim 2, wherein the at least a spacing plate extends from a joint of the first and second edge portions of the annular wall towards a joint of the corresponding sidewall and an adjacent sidewall.

5. The speaker set as described in claim 1, wherein a thickness of the at least a spacing plate is greater than a thickness of any of the sidewalls of the shell.

6. The speaker set as described in claim 1, further comprising a hollow frame for being sandwiched between an open side of the shell and a printed circuit board of the electronic product.

7. The speaker set as described in claim 6, wherein the frame is made of anti-vibration materials.

8. An electronic product comprising:

a casing containing a speaker set therein and defining a vent hole therein, the speaker set comprising:

a printed circuit board;

a hollow shell comprising a base wall and a plurality of sidewalls surrounding the base wall and hermetically attached to the printed circuit board, an inner space enclosed by the printed circuit board, the base wall and the sidewalls being divided into a first chamber, a second chamber and a third chamber via an annular wall and at least a spacing plate connecting the annular wall with a corresponding sidewall, the third chamber communicating with the second chamber via at least an inverted hole defined in the at least a spacing plate, and with the vent hole of the casing via a vent hole defined in the corresponding sidewall; and a loudspeaker engaged with the annular wall of the shell and dividing the first chamber enclosed by the annular wall into a front chamber and a rear chamber, the front chamber communicating with the second chamber, and the rear chamber communicating with the third chamber, the loudspeaker having first tone holes communicating with the rear chamber and second tone holes communicating with the front chamber.

9. The electronic product as claimed in claim 8, wherein the shell further comprises a flange disposed at a bottom of the annular wall in the first chamber, the loudspeaker being mounted on the flange and dividing the first chamber into the front and rear chambers.

10. The electronic product as claimed in claim 8, wherein the annular wall comprises a first edge portion disposed corresponding to the third chamber and a second edge portion disposed corresponding to the second chamber, the third chamber communicating with the rear chamber of the first chamber via a slot defined at a bottom of the first edge portion, the second chamber communicating with the front chamber of the first chamber via a height difference formed between a front surface of the second edge portion of the annular wall and a front surface of the first edge portion of the annular wall.

11. The electronic product as claimed in claim 10, wherein the at least a spacing plate connects a joint of the first and second edge portions of the annular wall with a middle portion of the corresponding sidewall.

12. The electronic product as claimed in claim 10, wherein the at least a spacing plate extends a joint of the first and second edge portions of the annular wall towards a joint of the corresponding sidewall and an adjacent sidewall.

13. The electronic product as claimed in claim 8, wherein a thickness of the at least a spacing plate is greater than a thickness of any of the sidewalls of the shell.

14. The electronic product as claimed in claim 8, further comprising a hollow frame sandwiched between an open side of the shell and the printed circuit board of the electronic product so as to form a first resonance chamber communicating with the first tone holes of the loudspeaker and a second resonance chamber communicating with the second tone holes of the loudspeaker, the first resonance chamber communicating with the second resonance chamber via the at least an inverted hole.

15. The electronic product as claimed in claim 14, wherein the frame is made of anti-vibration materials selected from one of rubber and glass fiber cloth.

* * * * *